(12) United States Patent
Momiuchi et al.

(10) Patent No.: US 11,800,249 B2
(45) Date of Patent: *Oct. 24, 2023

(54) IMAGING DEVICE FOR CONNECTION WITH A CIRCUIT ELEMENT

(71) Applicant: SONY SEMICONDUCTOR SOLUTIONS CORPORATION, Kanagawa (JP)

(72) Inventors: Yuta Momiuchi, Kanagawa (JP); Yuji Takaoka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/646,751

(22) Filed: Jan. 3, 2022

(65) Prior Publication Data

US 2022/0132059 A1    Apr. 28, 2022

Related U.S. Application Data (63) Continuation of application No. 16/972,862, filed as application No. PCT/JP2019/014760 on Apr. 3, 2019, now Pat. No. 11,245,863.

(30) Foreign Application Priority Data

Jun. 13, 2018 (JP) ................. 2018-112742

(51) Int. Cl.
*H04N 25/70* (2023.01)
*H01L 27/146* (2006.01)
(Continued)

(52) U.S. Cl.
CPC ............. *H04N 25/70* (2023.01); *G03B 17/02* (2013.01); *H01L 27/146* (2013.01);
(Continued)

(58) Field of Classification Search
CPC ........ H04N 25/70; H04N 23/00; H04N 23/54; H04N 25/44; H04N 23/57; H01L 27/146;
(Continued)

(56) References Cited

U.S. PATENT DOCUMENTS

| | | | |
|---|---|---|---|
| 2006/0171698 A1* | 8/2006 | Ryu | ................... H01L 31/02325 257/E31.127 |
| 2008/0083980 A1* | 4/2008 | Yang | ................. H01L 27/14683 257/E27.15 |
| 2018/0211989 A1* | 7/2018 | Hogyoku | .......... H01L 27/14627 |

FOREIGN PATENT DOCUMENTS

| | | |
|---|---|---|
| CN | 101211945 A | 7/2008 |
| CN | 107851651 A | 8/2017 |

(Continued)

OTHER PUBLICATIONS

International Search Report and Written Opinion of PCT Application No. PCT/JP2019/014760, dated Jun. 25, 2019, 09 pages of English Translation and 08 pages of ISRWO.

(Continued)

*Primary Examiner* — Twyler L Haskins
*Assistant Examiner* — Akshay Trehan
(74) *Attorney, Agent, or Firm* — CHIP LAW GROUP (57) ABSTRACT

A rewiring region 22 is provided in a region other than a pixel region 21 on a front face (pixel formation surface) FA of an imaging element 20. A mold part 30 is formed around the imaging element 20 other than on the front face FA. Rewiring layers 41*b*, 42*b*, and 43*b* that connect an external terminal and a pad 23 provided in the rewiring region 22 are formed via insulating layers 41*a*, 42*a*, and 43*a* on a side of the pixel formation surface of the imaging element 20 and the mold part 30. Therefore, connection to a substrate can be made possible even if the spacing between the pads is narrowed, a mounting surface of an imaging device 10 is (Continued)

also on the side of the pixel formation surface, and reduction in size and height can be achieved.

16 Claims, 8 Drawing Sheets

(51) Int. Cl.
    *H04N 23/00* (2023.01)
    *H04N 23/54* (2023.01)
    *H04N 23/57* (2023.01)
    *H04N 25/44* (2023.01)
    *G03B 17/02* (2021.01)
    *H05K 1/18* (2006.01)
    *H05K 3/10* (2006.01)

(52) U.S. Cl.
CPC .. *H01L 27/14618* (2013.01); *H01L 27/14636* (2013.01); *H04N 23/00* (2023.01); *H04N 23/54* (2023.01); *H04N 23/57* (2023.01); *H04N 25/44* (2023.01); *H05K 1/185* (2013.01); *H05K 3/103* (2013.01); *H05K 2201/095* (2013.01); *H05K 2201/09118* (2013.01)

(58) Field of Classification Search
CPC ........ H01L 27/14618; H01L 27/14636; G03B 17/02; H05K 1/185; H05K 3/0014; H05K 3/10; H05K 3/101; H05K 3/103; H05K 3/284; H05K 5/0034; H05K 2201/05; H05K 2201/09118; H05K 2201/09218; H05K 2201/095; H05K 2201/10666; H05K 2201/10674; H05K 2203/1305–1327

USPC .................................................. 348/294–324
See application file for complete search history.

(56) References Cited

FOREIGN PATENT DOCUMENTS

| | | | |
|---|---|---|---|
| DE | 102007063342 A1 | 7/2008 | |
| EP | 1686628 A2 | 8/2006 | |
| JP | 2002-299592 A | 10/2002 | |
| JP | 2002299592 A * | 10/2002 | ... H01L 2224/16225 |
| JP | 2006-216935 A | 8/2006 | |
| JP | 2008-211179 A | 9/2008 | |
| JP | 2008-235869 A | 10/2008 | |
| JP | 2017-152530 A | 8/2017 | |
| JP | 2017152530 A * | 8/2017 | ............. H01L 23/02 |
| KR | 10-2006-0088189 A | 8/2006 | |
| KR | 10-2008-0063223 A | 7/2008 | |
| TW | 200834840 A | 8/2008 | |
| WO | 2017/014072 A1 | 1/2017 | |

OTHER PUBLICATIONS

Notice of Allowance for U.S. Appl. No. 16/972,862, dated Sep. 28, 2021, 11 pages.

Non-Final Office Action for U.S. Appl. No. 16/972,862, dated Jun. 8, 2021, 15 pages.

International Preliminary Report on Patentability of PCT Application No. PCT/JP2019/014760, dated Dec. 24, 2020, 09 pages of English Translation and 05 pages of IPRP.

* cited by examiner

IMAGING DEVICE FOR CONNECTION WITH A CIRCUIT ELEMENT

CROSS REFERENCE TO RELATED APPLICATIONS

This application is a continuation application of U.S. patent application Ser. No. 16/972,862, filed on Dec. 7, 2020, which is U.S. National Phase of International Patent Application No. PCT/JP2019/014760 filed on Apr. 3, 2019, which claims priority benefit of Japanese Patent Application No. JP 2018-112742 filed in the Japan Patent Office on Jun. 13, 2018. Each of the above-referenced applications is hereby incorporated herein by reference in its entirety.

TECHNICAL FIELD

The present technology relates to an imaging device, and makes it possible to easily reduce the size and height of the imaging device.

BACKGROUND ART

Conventionally, imaging devices have been developed to be higher in pixel count and to have more functions. Furthermore, the pitch between pins has been made narrower so that the package can be downsized even if the number of pins increases due to the increase in the pixel count, the increase in the number of functions, and the like. For example, in Patent Document 1, a substrate in which a first die receiving cavity is formed on the upper front face and conductive wiring is provided inside thereof is used, a first die having a microlens in the first die receiving cavity is provided, a first dielectric layer having an opening for exposing the microlens is formed on the first die and the substrate, and a redistribution conductive layer is provided to connect with the first die and the conductive wiring. Furthermore, a lens holder on which a lens is attached is attached on the substrate.

CITATION LIST

Patent Document

Patent Document 1: Japanese Patent Application Laid-Open No. 2008-235869

SUMMARY OF THE INVENTION

Problems to be Solved by the Invention

Meanwhile, with the configuration as in Patent Document 1 being employed, the cost of processing the substrate is high, and it is difficult to reduce the height as a tilt of the first die with respect to the cavity may be caused due to the provision of the first die inside the cavity.

In view of the above, it is an object of the present technology to easily reduce the size and height of an imaging device.

Solutions to Problems

A first aspect of the present technology is directed to: an imaging device including: an imaging element provided with a rewiring region in a region other than a pixel region on a pixel formation surface; a mold part formed around the imaging element other than on the pixel formation surface; and a rewiring layer that connects an external terminal and a pad provided in the rewiring region, the rewiring layer being provided on a side of the pixel formation surface of the imaging element and the mold part.

According to the present technology, the imaging element is provided with the rewiring region in a region other than the pixel region on the pixel formation surface. The mold part is formed around the imaging element other than the pixel formation surface. The mold part is formed in such a manner that a sealing material, which is, for example, a liquid sealing material is applied from the surface of the imaging element opposite to the pixel formation surface. The rewiring layer that connects the external terminal and the pad provided in the rewiring region is formed on the side of the pixel formation surface of the imaging element and the mold part by, for example, a wafer process. Furthermore, one or a plurality of the rewiring layers is laminated with an insulating layer in between, and the outermost rewiring layer is used as an external terminal. An insulating layer is formed on the rewiring layer connected to the external terminal.

The imaging element and the mold part may have a predetermined thickness obtained by grinding a surface opposite to the pixel formation surface, and a through via may be provided in the mold part and one end of the through via may be connected to the rewiring layer. Furthermore, a region for arranging a circuit element to be connected to the rewiring layer may be provided on the side of the pixel formation surface of the mold part, and the external terminal may be arranged to correspond to a terminal of the circuit element.

The reflectance of the end surface on the side of the pixel region in a rewiring part in which the rewiring layer and the insulating layer are laminated is set to equal to or less than a predetermined value. For example, the insulating layer may include a color or a material by which the reflectance of the end surface becomes equal to or less than the predetermined value, and an antireflection film may be formed on the end surface. Furthermore, the end surface may be subject to roughening treatment, and the rewiring layer may be formed in a region inside the insulating layer.

Furthermore, a lens unit may be provided on the side of the pixel formation surface of the imaging element, and transmitted light of the lens unit may be made incident on the pixel region of the imaging element. In this case, a substrate is provided between the imaging element and the lens unit, and an opening that allows the transmitted light of the lens unit to be incident on the pixel region of the imaging element is formed in the substrate. Furthermore, the rewiring layer of the imaging element is electrically connected to a terminal portion provided on a surface of the substrate on the side of the imaging element.

Effects of the Invention

According to the present technology, the mold part is formed around, other than on the pixel formation surface, the imaging element provided with the rewiring region in the region other than the pixel region on the pixel formation surface. The rewiring layer that connects the external terminal and the pad provided in the rewiring region is formed on the side of the pixel formation surface of the imaging element and the mold part. Therefore, connection to the substrate can be made possible by rewiring even if the spacing between the pads is made narrower than in an imaging device in which a stud bump is formed on a pad, for example, and the mounting surface of the imaging device is on the side of the pixel formation surface, whereby the size and height of the imaging device can be easily reduced. Note that the effects described herein are merely examples and are not limited, and there may be additional effects.

MODE FOR CARRYING OUT THE INVENTION

Hereinafter, embodiments for implementing the present technology will be described. Note that descriptions will be given in the following order. 1. First Embodiment 2. Second Embodiment 3. Third Embodiment 4. Fourth Embodiment 5. Fifth Embodiment 6. Other Embodiments.

Figure 1:
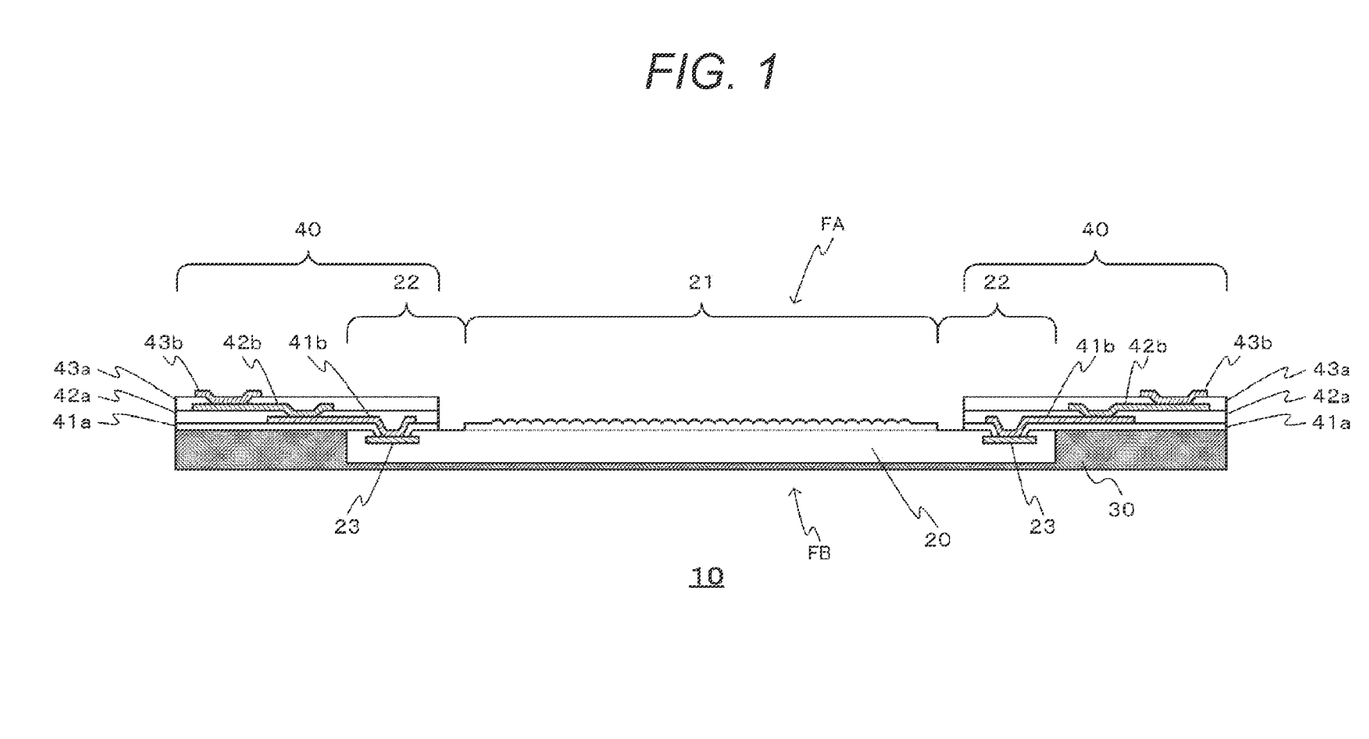
FIG. 1 is a schematic cross-sectional view exemplifying a configuration of a first embodiment.
Figure 2:
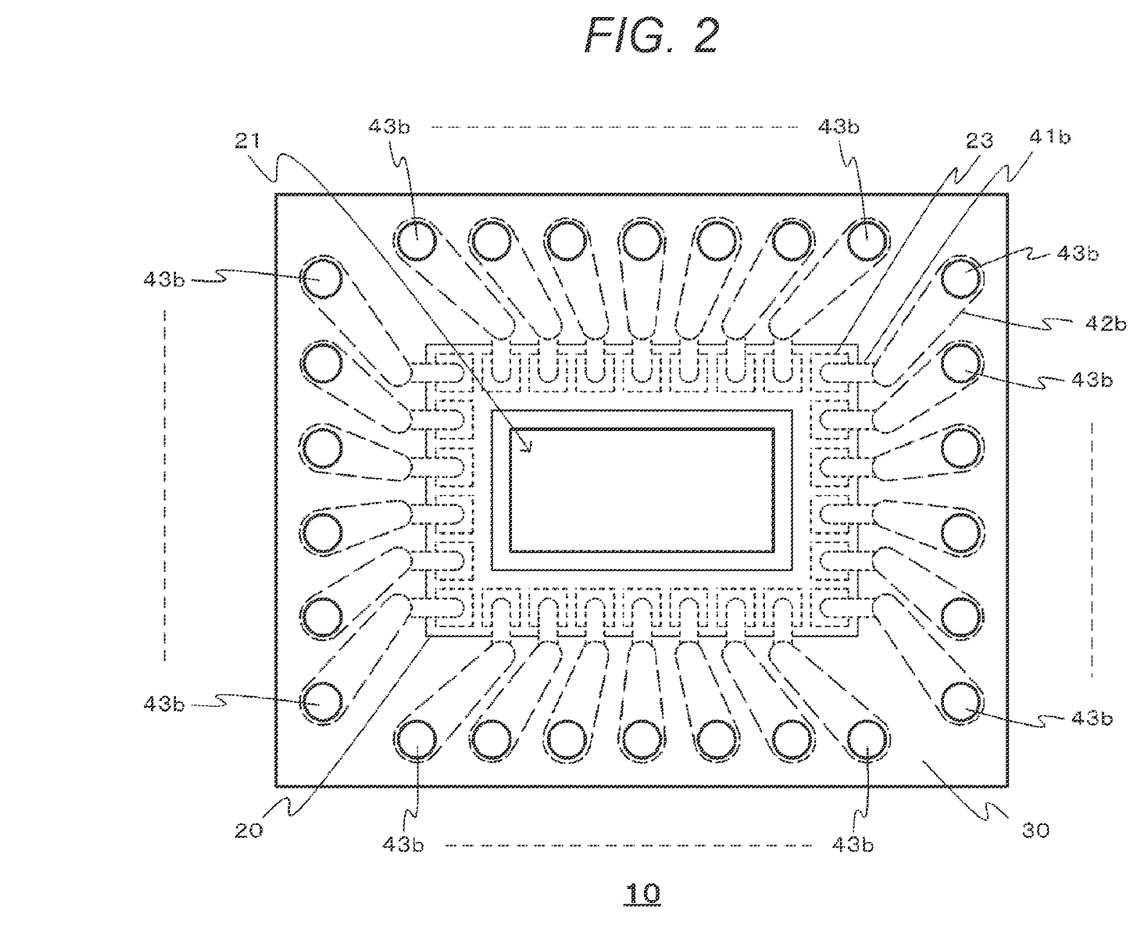
FIG. 2 is a plan view exemplifying the configuration of the first embodiment.

<1. First Embodiment> A first embodiment of an imaging device according to the present technology will be described with reference to the accompanying drawings. FIG. 1 exemplifies a schematic cross-sectional view exemplifying a configuration of the first embodiment, and FIG. 2 illustrates a plan view exemplifying the configuration of the first embodiment.

An imaging device 10 is configured using an imaging element 20 in which pixels that perform photoelectric conversion are formed in, for example, a two-dimensional matrix. Note that, in the imaging element 20, a region where the pixels are provided is referred to as a pixel region 21, a face of the imaging device 10 where incident light is emitted onto the imaging element 20 is referred to as a front face FA, and a face on the opposite side is referred to as a back face FB.

The imaging element 20 has a rewiring region 22 in a region other than the pixel region 21 on the front face (also referred to as a pixel formation surface) FA. Furthermore, in the imaging device 10, a mold part 30 is provided around the imaging element 20 excluding the pixel region 21 and the rewiring region 22.

A pad 23 is provided in the rewiring region 22 of the imaging element 20, and the rewiring region 22 and the mold part 30 are used as a rewiring part 40 for electrically connecting the pad 23 and an external terminal having a pitch width wider than that of the pad 23.

In the rewiring part 40, the outermost rewiring layer is used as an external terminal, and an insulating layer is provided on the rewiring layer connected to the external terminal. For example, in the rewiring part 40, an insulating layer 41a is provided on the front faces of the rewiring region 22 and the mold part 30, and an opening is provided at the position of the pad 23 in the insulating layer 41a. A rewiring layer 41b is provided on the front face of the insulating layer 41a using a conductive material, and one end of the rewiring layer 41b is electrically connected to the pad 23 via the opening provided in the insulating layer 41a.

An insulating layer 42a is provided in a region where the rewiring layer 41b is not provided on the front face of the rewiring layer 41b and the front face of the insulating layer 41a, and an opening is provided at a position on the side of the other end of the rewiring layer 41b in the insulating layer 42a.

A rewiring layer 42b is provided on the front face of the insulating layer 42a using a conductive material, and one end of the rewiring layer 42b is electrically connected to the other end side of the rewiring layer 41b via the opening provided in the insulating layer 42a. An insulating layer 43a is provided in a region where the rewiring layer 42b is not provided on the front face of the rewiring layer 42b and the front face of the insulating layer 42a, and an opening is provided at a position on the side of the other end of the rewiring layer 42b in the insulating layer 43a.

A rewiring layer 43b to be electrically connected to the other end side of the rewiring layer 42b to serve as an external terminal is provided in the opening of the insulating layer 43a using a conductive material. With the rewiring part 40 configured in this manner, the pad 23 provided in the rewiring region 22 and the rewiring layer 43b serving as an external terminal are electrically connected to each other, and the insulating layer is provided on the rewiring layer connected to the external terminal. Moreover, since the insulating layer is provided between the rewiring layers, it becomes possible to suppress short circuits between the rewiring layers, corrosion of the rewiring layers, and the like. Note that each insulating layer may be formed using the same material, or may be formed using different materials. Furthermore, each rewiring layer may be formed using the same material, or may be formed using different materials.

Furthermore, since the extending direction of the rewiring layer provided for each pad of the imaging element is set to a direction radiating from the position of the imaging element 20, the interval of the rewiring layers 43b connected to the pads 23, that is, the interval between the external terminals can be set wider even if the interval between the pads 23 of the imaging element 20 is narrow, whereby it is possible to provide the imaging device 10 of a fan-out (FO) type chip scale package (CSP) whose mounting surface is the front face on which light is made incident. Furthermore, it becomes possible to make the pitch between the pads of the imaging element narrower to increase the density as compared with a case of providing a stud bump on a through silicon via (TSV) or a pad.

Next, a manufacturing process of the imaging device will be described with reference to FIGS. 3A, 3B, 3C, 3D, and 3E. The manufacturing process of the imaging device includes a rearrangement step, a mold part forming step, an insulating layer forming step, a rewiring layer forming step, and a dicing step.

In FIGS. 3A, 3B, 3C, 3D, and 3E, FIG. 3A is a diagram for explaining the rearrangement step. With regard to the imaging elements 20 separated by wafer dicing, only the imaging elements 20 determined to be non-defective items are selected on the basis of a result of conforming item determination performed in advance, and are rearranged on the dicing tape DP at predetermined intervals.

In FIGS. 3A, 3B, 3C, 3D, and 3E, FIG. 3B is a diagram for explaining the mold part forming step. In the mold part forming step, a mold part is formed around the imaging element 20 except for the pixel formation surface. For example, spin coating or molding of resin is carried out while the pixel formation surface is protected, thereby forming the mold part 30. In this state, the mold parts of respective imaging devices are connected. Thereafter, a plurality of imaging elements integrated by forming the mold part is inverted and arranged on the dicing tape DP to expose the pixel formation surface of the imaging element 20. Note that, although FIGS. 3A and 3B exemplify a case where the imaging element 20 is rearranged in a face-down state to form the mold part so as to protect the pixel region of the imaging element 20, the imaging element 20 may be rearranged in a face-up state to form the mold part while the pixel region is protected.

In FIGS. 3A, 3B, 3C, 3D, and 3E, FIG. 3C is a diagram for explaining the insulating layer forming step. In the insulating layer forming step, the insulating layer 41a is formed in a region other than the pad 23 in the rewiring region by a wafer process such as chemical vapor deposition (CVD).

In FIGS. 3A, 3B, 3C, 3D, and 3E, FIG. 3D is a diagram for explaining the rewiring layer forming step. In the rewiring forming step, the rewiring layer 41b is extended in the radial direction from the pad 23, that is, in the direction radiating from the position of the imaging element 20, by a wafer process such as sputtering.

Furthermore, the insulating layer forming step and the rewiring layer forming step are repeated, and in a case where the rewiring layer 41b (42b) is formed on the upper surface of the insulating layer 41a (42a) in the insulating layer forming step, the insulating layer 42a (43a) is formed in a region where the rewiring layer 41b (42b) is not provided on the upper surface of the insulating layer 41a (42a) and the upper surface of the rewiring layer 41b (42b), and an opening is formed to enable electrical connection with the rewiring layer. Furthermore, in the rewiring layer forming step, the rewiring layer 42b (43b) is formed on the upper surface of the insulating layer 42a (43a) and electrically connected to the rewiring layer 41b (42b) as a lower layer. By repeating the insulating layer forming step and the rewiring layer forming step in this manner, a plurality of rewiring layers can be laminated on the rewiring part 40 of the imaging device illustrated in FIG. 1 with the insulating layer interposed therebetween.

In FIGS. 3A, 3B, 3C, 3D, and 3E, FIG. 3E is a diagram for explaining the dicing step. In the dicing step, predetermined positions between the imaging elements in which the rewiring parts 40 are formed by the insulating layer forming step and the rewiring layer forming step being repeated are cut to perform individualization, thereby generating imaging devices.

According to the first embodiment as described above, connection to a substrate can be made possible even if the spacing between the pads is narrowed, and the mounting surface of the imaging device is also on the side of the pixel formation surface, whereby the size and height of the imaging device can be easily reduced.

Figure 4:
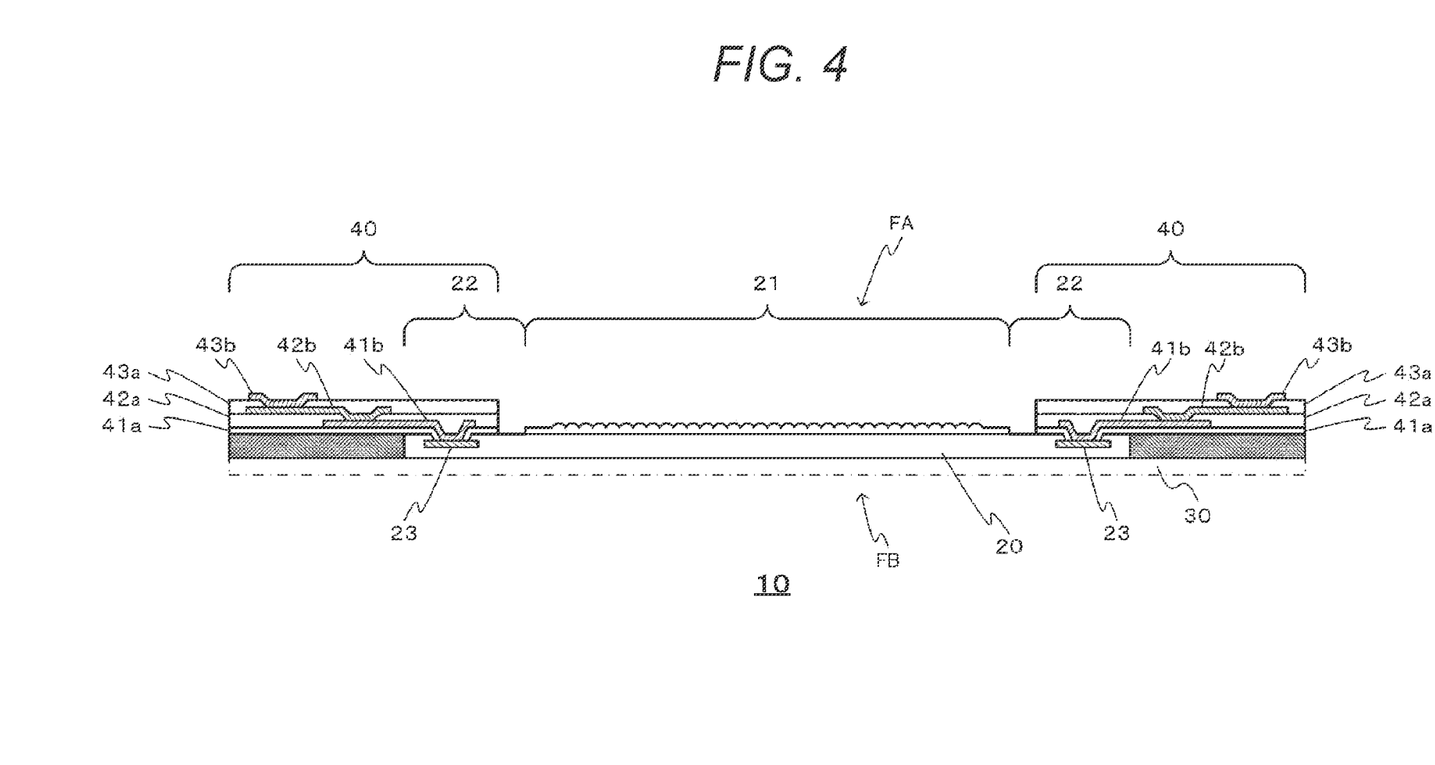
FIG. 4 is a schematic cross-sectional view exemplifying a configuration of a second embodiment.

<2. Second Embodiment> Next, in a second embodiment, the height of an imaging device is made shorter than that in the first embodiment. In the second embodiment, in a similar manner to the first embodiment, a rearrangement step, a mold part forming step, an insulating layer forming step, a rewiring layer forming step, and a dicing step are performed, and a back face grinding step is performed before the dicing step.

In the back face grinding step, a back face is exposed and ground. In the grinding, not only a resin portion but also a substrate of an imaging element 20 may be ground, and the height of the imaging device can be further reduced if the substrate of the imaging element 20 is also ground. FIG. 4 is a schematic cross-sectional view exemplifying a configuration of the second embodiment. Note that the position indicated by a dash-dot line illustrates, as a reference, the position of the first embodiment in which the back face grinding is not performed.

As described above, according to the second embodiment, a wafer process is used in the insulating layer forming step and the rewiring layer forming step so that the back face grinding can be easily carried out before the dicing step, whereby the height of the imaging device can be reduced more easily than in the first embodiment.

Figure 5:
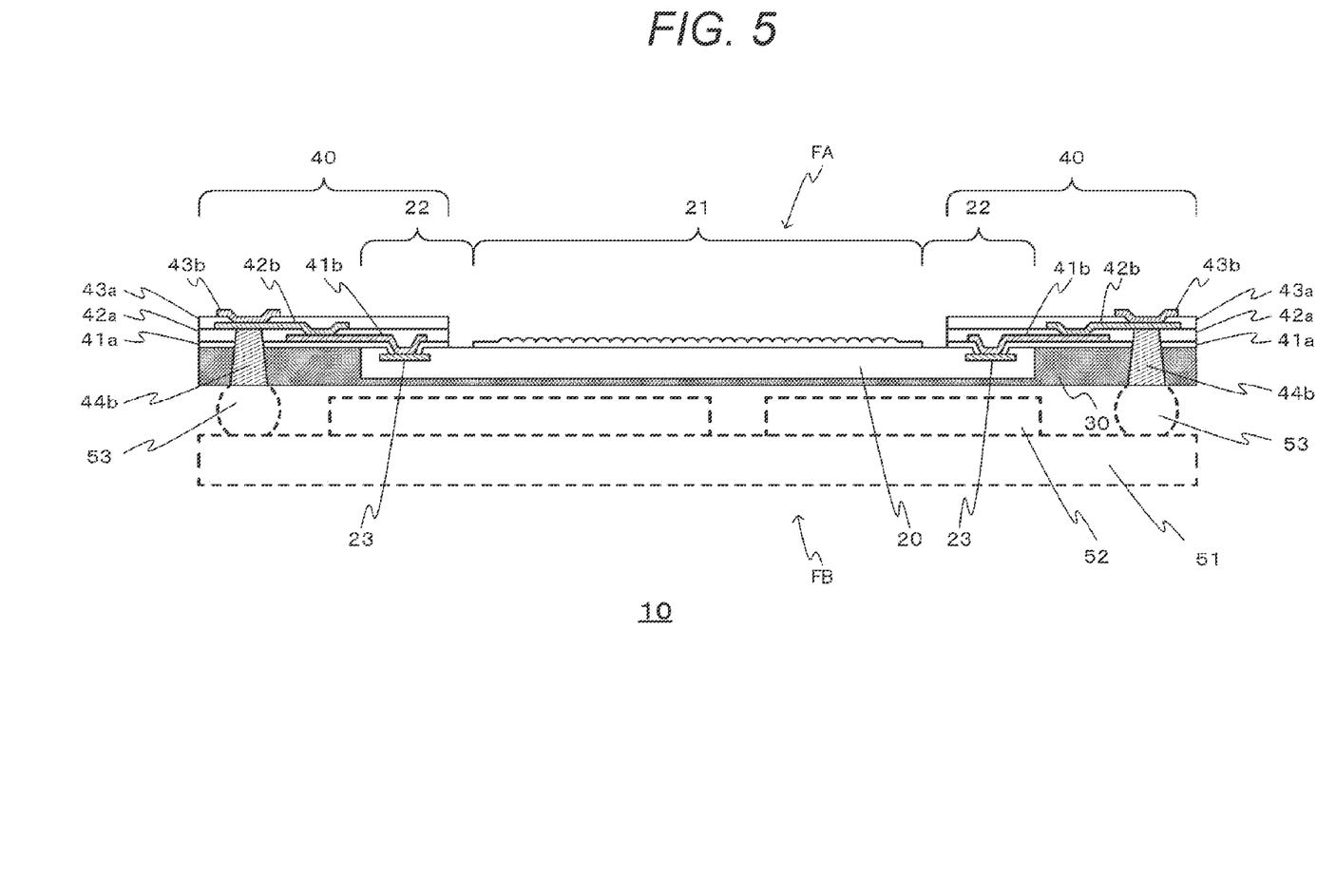
FIG. 5 is a schematic cross-sectional view exemplifying a configuration of a third embodiment.

<3. Third Embodiment> A third embodiment exemplifies a configuration that enables high-density mounting. In a similar manner to the first embodiment, an imaging device 10 is configured using an imaging element 20, and a mold part 30 is provided around the imaging element 20 excluding a pixel region 21 and a rewiring region 22.

FIG. 5 is a schematic cross-sectional view exemplifying the configuration of the third embodiment, and a pad 23 is provided in the rewiring region 22 of the imaging element 20. The rewiring region 22 and the mold part 30 are used as a rewiring part 40 for electrically connecting the pad 23 and an external terminal having a pitch width wider than that of the pad 23. Furthermore, a through via is provided in the mold part 30 in the third embodiment.

In the rewiring part 40, an insulating layer 41a is provided on the front faces of the rewiring region 22 and the mold part 30, and an opening is provided at the position of the pad 23 in the insulating layer 41a.

A rewiring layer 41b is provided on the front face of the insulating layer 41a, and one end of the rewiring layer 41b is electrically connected to the pad 23 via the opening provided in the insulating layer 41a. An insulating layer 42a is provided in a region where the rewiring layer 41b is not provided on the front face of the rewiring layer 41b and the front face of the insulating layer 41a, and an opening is provided at a position on the side of the other end of the rewiring layer 41b in the insulating layer 42a.

A rewiring layer 42b is provided on the front face of the insulating layer 42a, and one end of the rewiring layer 42b is electrically connected to the other end side of the rewiring layer 41b via the opening provided in the insulating layer 42a. An insulating layer 43a is provided in a region where the rewiring layer 42b is not provided on the front face of the rewiring layer 42b and the front face of the insulating layer 42a, and an opening is provided at a position on the side of the other end of the rewiring layer 42b in the insulating layer 43a.

A rewiring layer 43b to be electrically connected to the other end side of the rewiring layer 42b to serve as an external terminal is provided in the opening of the insulating layer 43a.

A through via 44b to be electrically connected to the rewiring layer 42b is provided in the mold part 30. The through via 44b is formed in such a manner that a hole that penetrates the mold part 30 is made using a laser or the like and the inside of the hole is filled with a conductive material such as copper, for example.

According to the third embodiment as described above, it becomes possible to provide a substrate 51 on which a circuit element (e.g., a semiconductor element that performs image signal processing, etc.) 52 is mounted in a state of being electrically connected to the back face of the imaging device 10 using a connection (e.g., a solder ball, etc.) 53. Therefore, high integration can be easily achieved. Furthermore, with the rewiring layer 43b to be used as an external terminal and the through via 44b being provided, the circuit element can be provided on either the front face side or the back face side of the imaging device 10, whereby a degree of flexibility in layout of the circuit element and the like can be increased.

Figure 6:
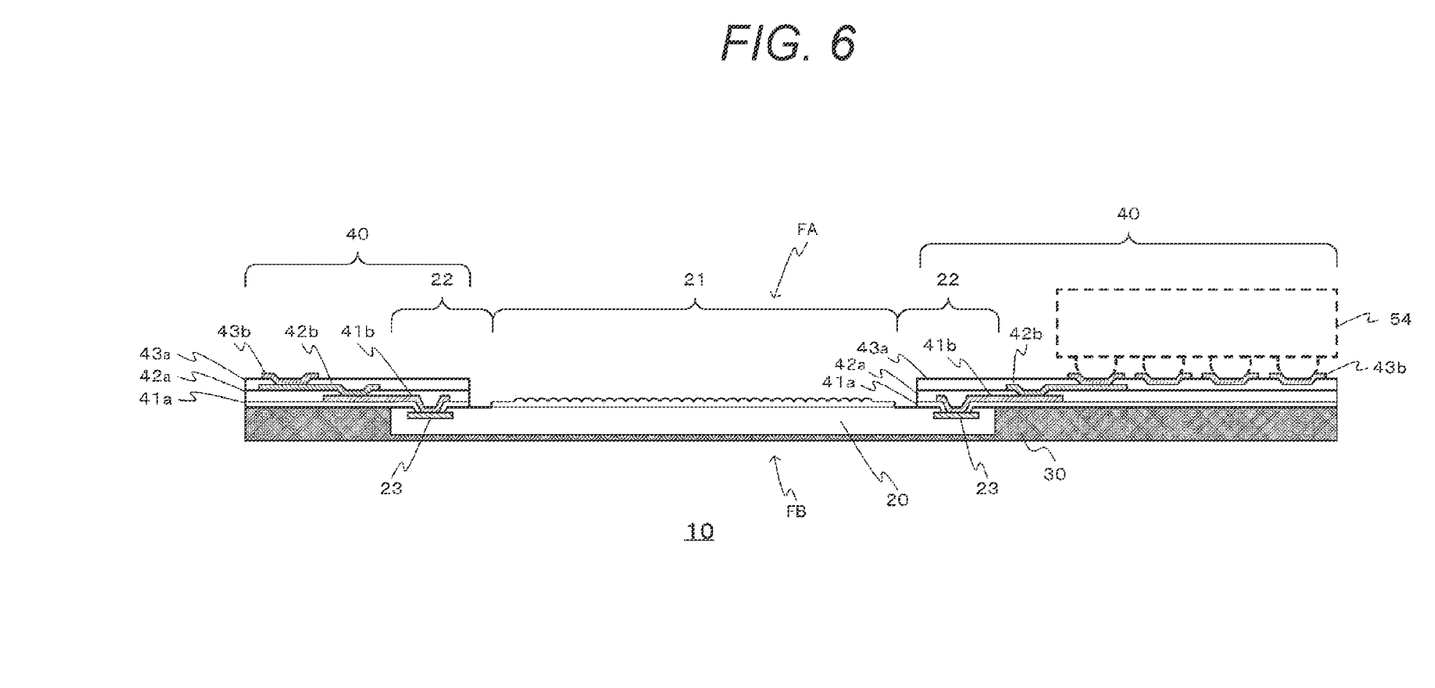
FIG. 6 is a schematic cross-sectional view exemplifying a configuration of a fourth embodiment.

<4. Fourth Embodiment> A fourth embodiment exemplifies a configuration that enables efficient mounting. In a similar manner to the first embodiment, an imaging device 10 is configured using an imaging element 20, and a mold part 30 is provided around the imaging element 20 excluding a pixel region 21 and a rewiring region 22. Furthermore, the mold part 30 is formed in such a manner that a rewiring part 40 has a region wider than that of the first embodiment so that a circuit element (e.g., semiconductor chip) can be mounted on the rewiring part 40.

FIG. 6 is a schematic cross-sectional view exemplifying the configuration of the fourth embodiment, and a pad 23 is provided in the rewiring region 22 of the imaging element 20.

In the rewiring part 40, an insulating layer 41a is provided on the front faces of the rewiring region 22 and the mold part 30, and an opening is provided at the position of the pad 23 in the insulating layer 41a.

A rewiring layer 41b is provided on the front face of the insulating layer 41a, and one end of the rewiring layer 41b is electrically connected to the pad 23 via the opening provided in the insulating layer 41a. An insulating layer 42a is provided in a region where the rewiring layer 41b is not provided on the front face of the rewiring layer 41b and the front face of the insulating layer 41a, and an opening is provided at a position on the side of the other end of the rewiring layer 41b in the insulating layer 42a.

A rewiring layer 42b is provided on the front face of the insulating layer 42a, and one end of the rewiring layer 42b is electrically connected to the other end side of the rewiring layer 41b via the opening provided in the insulating layer 42a. An insulating layer 43a is provided in a region where the rewiring layer 42b is not provided on the front face of the rewiring layer 42b and the front face of the insulating layer 42a, and an opening is provided at a position on the side of the other end of the rewiring layer 42b in the insulating layer 43a.

A rewiring layer 43b to be electrically connected to the other end side of the rewiring layer 42b to serve as an external terminal is provided in the opening of the insulating layer 43a.

Furthermore, the pad 23 is provided in the rewiring region 22, and the rewiring layer 43b is electrically connected to the pad 23 and used as an external terminal. Furthermore, the external terminal is provided at a position corresponding to the terminal of the semiconductor chip to be mounted on the mold part 30.

Figure 3A:
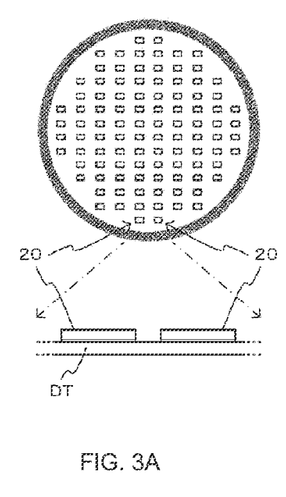
FIGS. 3A, 3B, 3C, 3D, and 3E are diagrams for explaining a manufacturing process of a method of manufacture.
Figure 3B:
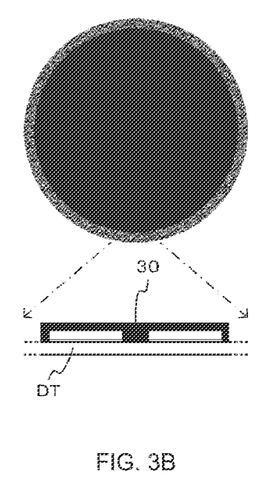
Figure 3C:
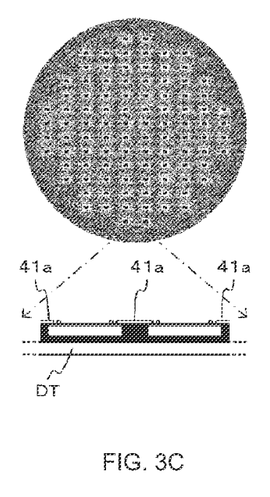
Figure 3D:
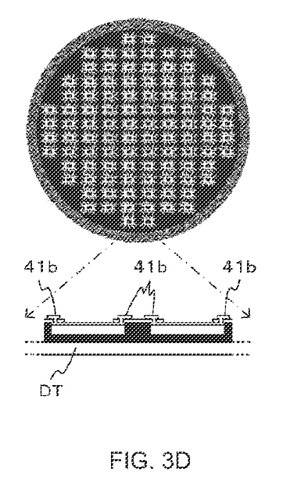
Figure 3E:
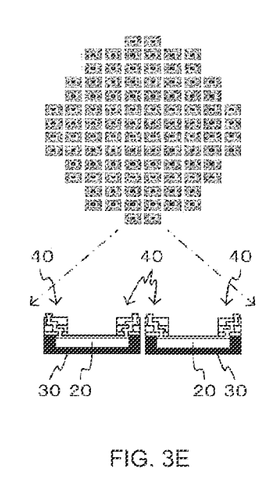

In the imaging device 10 having such a configuration, a semiconductor chip 54 is mounted on the rewiring part 40 by the Chip on Wafer (CoW) method before the dicing step illustrated in FIG. 3E is performed. For example, the semiconductor chip 54 is mounted at a predetermined position in the rewiring part 40 using a known device such as a flip chip bonder, and the rewiring layer 43b and the terminal of the semiconductor chip 54 are electrically connected to each other.

Thereafter, a blade is used to cut predetermined positions to perform individualization in the dicing step, thereby generating imaging devices.

According to the fourth embodiment as described above, a circuit element is mounted on the rewiring part before the dicing step, whereby the circuit element can be mounted efficiently.

Figure 7A:
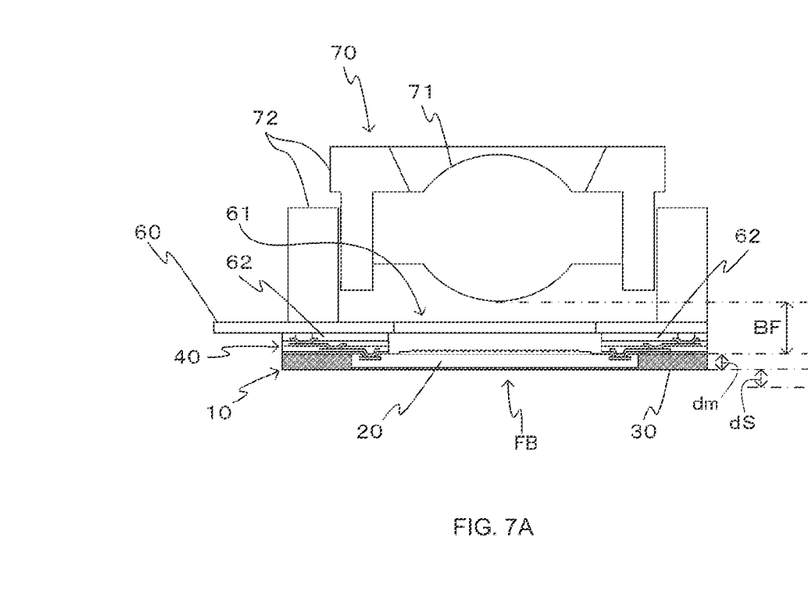
FIGS. 7A and 7B are a schematic cross-sectional view exemplifying a configuration of a fifth embodiment.
Figure 7B:
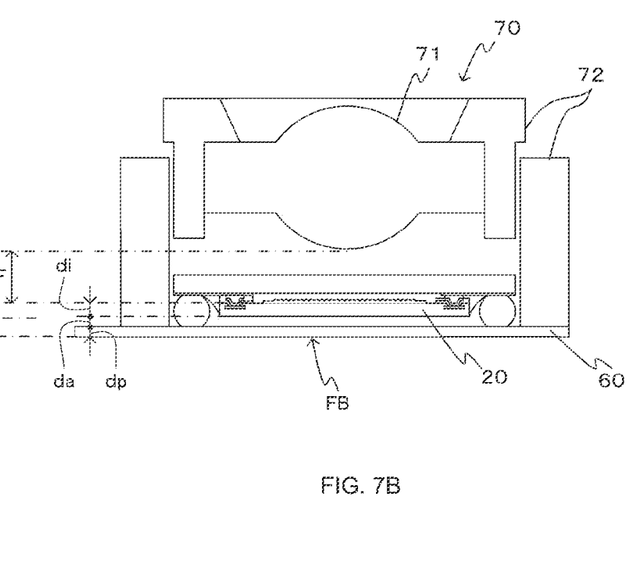

<5. Fifth Embodiment> In a fifth embodiment, a case where an imaging device is provided with a lens unit to be modularized will be described. FIGS. 7A and 7B are a schematic cross-sectional view exemplifying a configuration of the fifth embodiment. Note that FIG. 7A illustrates a configuration using the imaging device according to the present technology. Furthermore, FIG. 7B exemplifies a conventional imaging device of an FO type CSP.

A lens unit 70 includes a lens 71, and a lens holder 72 that holds the lens 71. In the imaging device according to the present technology, the mounting surface is a front face, a substrate 60 on which the imaging device 10 is mounted is provided between the imaging device 10 and the lens unit 70, and the imaging device 10 is attached onto one surface of the substrate 60 while the lens holder 72 is fixed to the other surface. The imaging device 10 and the substrate 60 are electrically connected to each other by the external terminal of the imaging device 10 being connected to a terminal portion provided on one surface of the substrate 60. The substrate 60 may be a flexible substrate, or may be a rigid substrate.

Furthermore, since the substrate 60 is provided between the imaging device 10 and the lens unit 70, the substrate 60 is provided with the lens 71 and an opening 61 for allowing the light having passed therethrough to enter the pixel region 21 of the imaging element 20. As described above, with the mounting surface of the imaging device set to the front face (light incident side), the substrate 60 can be included in the range of the back focus BF from the lens top to the front face of the imaging element 20. Therefore, in a case where the imaging device is provided with the lens unit to be modularized, the dimension of the module in the optical axis direction can be made thinner than that in the case where the mounting surface of the imaging device is set to the back face, as illustrated in FIG. 7B. Specifically, if a thickness dm of the mold part 30 is made thinner than the sum of a thickness di of the imaging element 20, a thickness dp of the substrate FB, and a distance da between the imaging element 20 and the substrate FB, the dimension can be reduced by a difference dS between the sum (di+dp+da) and the thickness dm of the mold part 30. Furthermore, by using the imaging device according to the second embodiment, it becomes possible to further reduce the dimension of the module in the optical axis direction.

The electrical connection between the substrate 60 and the rewiring part 40 of the imaging device 10 may be performed by, for example, flip chip bonding using conductive bumps (gold bumps, copper bumps, solder bumps, etc.) or an anisotropic conductive film ACF, or other methods may be used.

An underfill part 62 may be provided between the substrate 60 and the rewiring part 40 of the imaging device 10 to suppress occurrence of a crack at the connection, moderate the difference in the thermal expansion coefficient between the two, improve the strength, and the like. The underfill part 62 is formed by, for example, electrically connecting the rewiring part 40 and the substrate 60 and then injecting a liquid underfill material between the two. Furthermore, a sheet-like underfill material may be provided between the rewiring part 40 and the substrate 60, and then the rewiring part 40 and the substrate 60 may be electrically connected.

Furthermore, the substrate 60 may be provided with, in addition to the imaging device 10 being electrically connected thereto, a connection component such as an active element or a passive element and a connector, and a connection terminal may be formed at the end portion.

As described above, according to the fifth embodiment, in a case where the imaging device is provided with the lens unit to be modularized, the height of the module can be reduced as compared with the case of using a conventional imaging device whose mounting surface is the back side.

Figure 8:
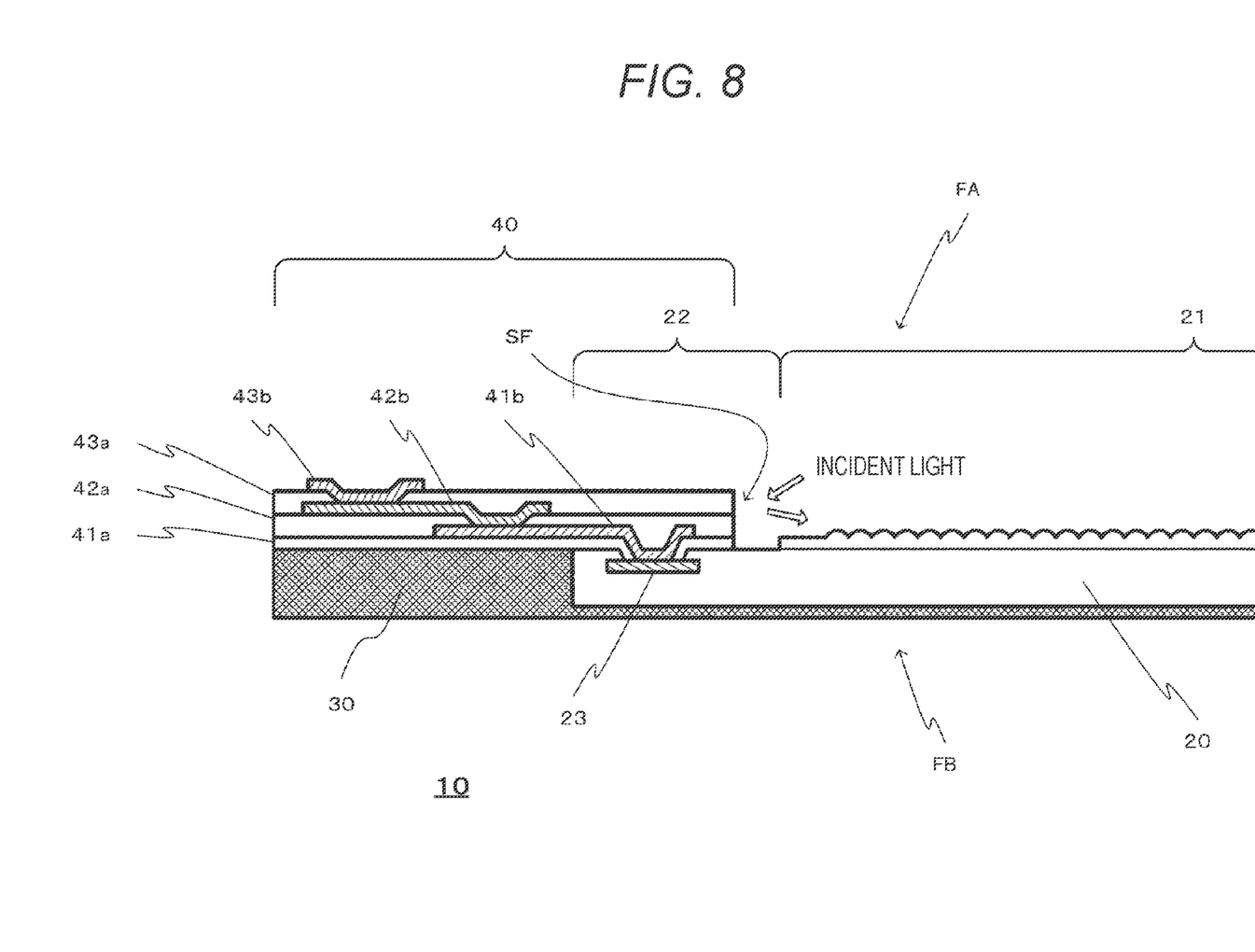
FIG. 8 is a diagram illustrating a rewiring part.

<6. Other Embodiments> Next, in another embodiment, a configuration for reducing deterioration in image quality of a captured image obtained by an imaging device 10 will be described. FIG. 8 illustrates a rewiring part.

In a case where a rewiring part 40 is formed around a pixel region 21 as in the embodiments described above, incident light of the imaging device 10 is reflected by an end surface SF on the side of the pixel region of a rewiring part 40 and is made incident on the pixel region 21, whereby there is a possibility that the image quality of the captured image may deteriorate.

In view of the above, in the another embodiment, the reflectance of the end surface SF is set to a predetermined value or less at which the influence on the image quality is allowable to reduce the influence on the image quality due to the formation of the rewiring part 40. Specifically, the reflectance is reduced by processing the material used in the rewiring part and/or the end surface SF of the rewiring part on the side of the pixel region.

In the case of reducing the influence on the image quality by the material used in the rewiring part, a color or a material having a low reflectance is used as an insulating layer. For example, a black color having a low reflectance is used as a color of the material. Furthermore, a resin material containing carbon or the like is used as a type of the material.

As processing of the end surface SF of the rewiring part 40, the reflectance is reduced by performing the following processing, thereby reducing the influence on the image quality deterioration caused by the reflection on the end surface.

Formation of Antireflection Film An antireflection film is formed on the end surface of an insulating layer. A resin material, tape, or the like having a low reflectance is used as a material of the antireflection film. With the antireflection film formed using such a material, reflection at the end surface is reduced, whereby the influence on the image quality deterioration can be reduced.

Roughening Treatment of End Surface Roughening treatment is applied to each insulating layer end surface. Examples of the roughening treatment method include plasma treatment. With the end surface being subject to the roughening treatment in this manner, reflected light is dispersed so that the reflected light to enter the pixel region is reduced, whereby the influence on the image quality deterioration can be reduced.

Limitation of Region for Rewiring layer Formation A rewiring layer is provided in a region inside the insulating layer so as not to be exposed on the end surface. In a case where a metal film is used as a rewiring layer, for example, if the rewiring layer is exposed on the end surface, the amount of light reflected by the end surface increases as the metal film has a high reflectance. However, if the rewiring layer is provided in the region inside the insulating layer, there is no reflection by the rewiring layer, whereby the influence on the image quality deterioration can be reduced.

With the imaging device configured as described above, not only can the size and height of the imaging device be reduced, but also deterioration in image quality can be suppressed. Note that, although the case of providing three rewiring layers has been exemplified in the embodiments above, the rewiring layer may be one layer, two layers, or four or more layers.

The effects described herein are merely examples and are not limited, and there may be additional effects. Furthermore, the present technology should not be construed as being limited to the embodiments of the technology described above. The embodiments of the present technology disclose the present technology in a form of illustration, and it is obvious that those skilled in the art can modify or substitute the embodiments without departing from the gist of the present technology. That is, in order to determine the gist of the present technology, the scope of claims should be taken into consideration.

Furthermore, the imaging device according to the present technology can also have the following configurations.

(1) An imaging device including:
an imaging element provided with a rewiring region in a region other than a pixel region on a pixel formation surface;
a mold part formed around the imaging element other than on the pixel formation surface; and
a rewiring layer that connects an external terminal and a pad provided in the rewiring region, the rewiring layer being provided on a side of the pixel formation surface of the imaging element and the mold part.

(2) The imaging device according to (1), in which the imaging element and the mold part have a predetermined thickness obtained by grinding a surface opposite to the pixel formation surface.

(3) The imaging device according to (1) or (2), in which a through via is provided in the mold part, and one end of the through via is connected to the rewiring layer.

(4) The imaging device according to any one of (1) to (3), in which a region for arranging a circuit element to be connected to the rewiring layer is provided on the side of the pixel formation surface of the mold part, and the external terminal is arranged to correspond to a terminal of the circuit element.

(5) The imaging device according to any one of (1) to (4), in which one or a plurality of the rewiring layers is laminated with an insulating layer in between.

(6) The imaging device according to (5), in which an outermost layer of the rewiring layers is used as an external terminal, and an insulating layer is formed on the rewiring layer connected to the external terminal.

(7) The imaging device according to (5) or (6), in which a reflectance of an end surface on a side of the pixel region in a rewiring part in which the rewiring layer and the insulating layer are laminated is set to equal to or less than a predetermined value.

(8) The imaging device according to (7), in which the insulating layer includes a color or a material by which the reflectance of the end surface becomes equal to or less than the predetermined value.

(9) The imaging device according to (7) or (8), in which an antireflection film is provided on the end surface.

(10) The imaging device according to (7) or (8), in which the end surface is subject to roughening treatment.

(11) The imaging device according to any one of (7) to (10), in which the rewiring layer is provided in a region inside the insulating layer.

(12) The imaging device according to any one of (1) to (11), in which the mold part is formed using a sealing material.

(13) The imaging device according to (12), in which the sealing material includes liquid, and is applied from a surface of the imaging element opposite to the pixel formation surface.

(14) The imaging device according to any one of (1) to (13), in which a wafer process is used to form the rewiring layer.

(15) The imaging device according to any one of (1) to (14), in which a lens unit is provided on the side of the pixel formation surface of the imaging element, and transmitted light of the lens unit is made incident on the pixel region of the imaging element.

(16) The imaging device according to (15), in which a substrate is provided between the imaging element and the lens unit, and an opening that allows the transmitted light of the lens unit to be incident on the pixel region of the imaging element is formed in the substrate.

(17) The imaging device according to (15) or (16), in which the external terminal is electrically connected to a terminal portion provided on a surface of the substrate on a side of the imaging element.

INDUSTRIAL APPLICABILITY

In the imaging device according to the present technology, a mold part is formed around, other than on a pixel formation surface, an imaging element provided with a rewiring region in a region other than a pixel region on the pixel formation surface. A rewiring layer that connects an external terminal and a pad provided in the rewiring region is formed on a side of the pixel formation surface of the imaging element and the mold part. Therefore, the size and height of the imaging device can be easily reduced, which is suitable for, for example, a portable electronic device and the like.

REFERENCE SIGNS LIST

10 Imaging device
20 Imaging element
21 Pixel region
22 Rewiring region
23 Pad
30 Mold part
40 Rewiring part
41a, 42a, 43a Insulating layer
41b, 42b, 43b Rewiring layer
44b Through via
51, 60 Substrate
53 Connection
54 Semiconductor chip
61 Opening
62 Underfill part
70 Lens unit
71 Lens
72 Lens holder

The invention claimed is:
1. An optical device, comprising:
a pixel formation surface;
an imaging element that includes:
a lens;
a pixel region on the pixel formation surface; and
a rewiring region, wherein
the rewiring region is in a first region, of the imaging element, different from the pixel region, and
the rewiring region includes a pad;
a mold part around the imaging element, wherein the mold part is in a second region, of the optical device, different from the pixel formation surface;
a rewiring layer on each of a pixel formation surface side of the imaging element and a pixel formation surface side of the mold part, wherein the rewiring layer is configured to connect an external terminal and the pad; and
a third region on the pixel formation surface side of the mold part, wherein
the third region is for arrangement of a circuit element to be connected to the rewiring layer, and
the external terminal corresponds to a terminal of the circuit element.

2. The optical device according to claim 1, wherein each of the imaging element and the mold part has a specific thickness based on a grinding process on a surface of the optical device opposite to the pixel formation surface.

3. The optical device according to claim 1, wherein
the mold part includes a through via, and
one end of the through via is connected to the rewiring layer.

4. The optical device according to claim 1, further comprising:
an insulating layer; and
a plurality of rewiring layers including the rewiring layer, wherein at least one rewiring layer of the plurality of rewiring layers is laminated with the insulating layer.

5. The optical device according to claim 4, wherein
the rewiring layer is connected to the external terminal,
an outermost layer of the plurality of rewiring layers is the external terminal, and
the insulating layer is on the rewiring layer connected to the external terminal.

6. The optical device according to claim 4, further comprising a rewiring part that includes:
the rewiring layer laminated with the insulating layer; and
an end surface on a side of the pixel region, wherein the end surface has a reflectance one of equal to or less than a specific value.

7. The optical device according to claim 4, further comprising a rewiring part that includes an end surface subjected to a roughening treatment.

8. The optical device according to claim 6, wherein
the insulating layer includes one of a color or a material, and
the reflectance of the end surface is one of equal to or less than the specific value based on the one of the color or the material of the insulating layer.

9. The optical device according to claim 6, further comprising an antireflection film on the end surface.

10. The optical device according to claim 6, wherein the rewiring layer is inside the insulating layer.

11. The optical device according to claim 1, wherein the mold part includes a sealing material.

12. The optical device according to claim 11, wherein
the sealing material includes liquid, and
the sealing material is applied on a surface of the imaging element opposite to the pixel formation surface.

13. The optical device according to claim 1, wherein the rewiring layer is based on a wafer process.

14. The optical device according to claim 1, further comprising a lens unit on the pixel formation surface side of the imaging element, wherein the lens unit is configured transmit light, and
the transmitted light of the lens unit is incident on the pixel region of the imaging element.

15. The optical device according to claim 14, further comprising:
a substrate between the imaging element and the lens unit; and an opening in the substrate, wherein the opening allows the transmitted light from the lens unit to be incident on the pixel region of the imaging element.

16. The optical device according to claim 14, wherein
the external terminal is electrically connected to a terminal portion on a surface of a substrate, and
the substrate is on a specific side of the imaging element.

\* \* \* \* \*